(12) United States Patent
Handa

(10) Patent No.: US 12,284,860 B2
(45) Date of Patent: Apr. 22, 2025

(54) LIGHT-EMITTING ELEMENT HAVING A P-TYPE HOLE TRANSPORT LAYER WITH N-TYPE NANOPARTICLES DISPERSED THEREIN AND A DISPLAY DEVICE THEREOF

(71) Applicant: SHARP KABUSHIKI KAISHA, Sakai (JP)

(72) Inventor: Shinichi Handa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 439 days.

(21) Appl. No.: 17/642,454

(22) PCT Filed: Sep. 19, 2019

(86) PCT No.: PCT/JP2019/036735
§ 371 (c)(1),
(2) Date: Mar. 11, 2022

(87) PCT Pub. No.: WO2021/053787
PCT Pub. Date: Mar. 25, 2021

(65) Prior Publication Data
US 2022/0310962 A1     Sep. 29, 2022

(51) Int. Cl.
*H01L 29/08*     (2006.01)
*H10K 50/15*     (2023.01)
*H10K 102/00*    (2023.01)

(52) U.S. Cl.
CPC ....... *H10K 50/156* (2023.02); *H10K 2102/00* (2023.02); *H10K 2102/331* (2023.02)

(58) Field of Classification Search
CPC ............. H10K 50/156; H10K 2102/00; H10K 2102/331; H10K 50/155; H10K 59/35; H05B 33/14
See application file for complete search history.

(56) References Cited

U.S. PATENT DOCUMENTS

| | | | |
|---|---|---|---|
| 9,595,625 B2* | 3/2017 | Murayama | C01B 19/007 |
| 2005/0274944 A1* | 12/2005 | Jang | H05B 33/14 |
| | | | 438/22 |
| 2007/0103068 A1 | 5/2007 | Bawendi et al. | |
| 2008/0237628 A1* | 10/2008 | Satoh | H01L 33/18 |
| | | | 438/22 |
| 2010/0314639 A1* | 12/2010 | Taniguchi | C09K 11/0883 |
| | | | 257/89 |
| 2011/0140089 A1* | 6/2011 | Terao | H10K 50/17 |
| | | | 257/40 |

(Continued)

FOREIGN PATENT DOCUMENTS

| | | |
|---|---|---|
| JP | 2012-023388 A | 2/2012 |
| JP | 2017-168420 A | 9/2017 |

(Continued)

*Primary Examiner* — Ismail A Muse
(74) *Attorney, Agent, or Firm* — ScienBiziP, P.C.

(57) ABSTRACT

A light-emitting element includes: an anode; a cathode; a light-emitting layer between the anode and the cathode; and a hole transport layer between the anode and the light-emitting layer, the hole transport layer including: a p-type semiconductor layer of a p-type semiconductor material provided in a form of a layer; and a n-type semiconductor material dispersed in the p-type semiconductor layer.

20 Claims, 5 Drawing Sheets

(56) References Cited

U.S. PATENT DOCUMENTS

| | | | | |
|---|---|---|---|---|
| 2011/0284819 | A1* | 11/2011 | Kang | H10K 50/115 |
| | | | | 977/773 |
| 2012/0043532 | A1* | 2/2012 | Yasuda | H10K 50/11 |
| | | | | 257/40 |
| 2012/0138894 | A1* | 6/2012 | Qian | H10K 50/14 |
| | | | | 257/E33.012 |
| 2012/0187390 | A1 | 7/2012 | Okamoto et al. | |
| 2012/0238047 | A1 | 9/2012 | Bawendi et al. | |
| 2012/0292595 | A1 | 11/2012 | Bawendi et al. | |
| 2013/0213477 | A1* | 8/2013 | Nakayama | H10K 30/87 |
| | | | | 136/263 |
| 2015/0076469 | A1* | 3/2015 | Ikemizu | H10K 50/11 |
| | | | | 257/40 |
| 2016/0218308 | A1* | 7/2016 | Desilvestro | H10K 30/15 |
| 2016/0293872 | A1* | 10/2016 | Ko | H10K 85/50 |
| 2017/0062749 | A1 | 3/2017 | Seo et al. | |
| 2017/0125635 | A1 | 5/2017 | Bawendi et al. | |
| 2017/0271605 | A1* | 9/2017 | Steckel | H10K 50/115 |
| 2019/0214594 | A1 | 7/2019 | Jang et al. | |
| 2019/0245146 | A1* | 8/2019 | Seo | H10K 85/6576 |
| 2021/0083144 | A1* | 3/2021 | Xiang | H01L 33/14 |
| 2022/0328730 | A1* | 10/2022 | Kimoto | H10K 50/115 |
| 2023/0345753 | A1* | 10/2023 | Han | H10K 50/13 |
| 2024/0334730 | A1* | 10/2024 | Yu | H10K 50/156 |

FOREIGN PATENT DOCUMENTS

| | | | |
|---|---|---|---|
| KR | 20150084705 A | * | 6/2015 |
| WO | 2011/040238 A1 | | 4/2011 |

* cited by examiner

LIGHT-EMITTING ELEMENT HAVING A P-TYPE HOLE TRANSPORT LAYER WITH N-TYPE NANOPARTICLES DISPERSED THEREIN AND A DISPLAY DEVICE THEREOF

TECHNICAL FIELD

The disclosure relates to light-emitting elements and display devices.

BACKGROUND ART

Patent Literature 1, as an example, discloses a light-emitting element containing semiconductor nanocrystals. The light-emitting element is described as including a hole transport layer of NiO (inorganic material). This structure enables providing a light-emitting element with a long device life.

CITATION LIST

Patent Literature

Patent Literature 1: Japanese Unexamined Patent Application Publication, Tokukai, No. 2012-23388

SUMMARY

Technical Problem

There is a demand to improve the structure of the hole transport layer in a light-emitting element including a light-emitting layer containing quantum dots for improved luminous efficiency.

Solution to Problem

The disclosure, in an aspect thereof, is directed to a light-emitting element including: an anode; a cathode; a light-emitting layer between the anode and the cathode; and a hole transport layer between the anode and the light-emitting layer, the hole transport layer including: a p-type semiconductor layer of a p-type semiconductor material provided in a form of a layer; and a n-type semiconductor material dispersed in the p-type semiconductor layer.

The disclosure, in another aspect thereof, is directed to a display device including: an anode; a cathode; a first light-emitting layer between the anode and the cathode, the first light-emitting layer being configured to emit first light; a second light-emitting layer between the anode and the cathode, the second light-emitting layer being configured to emit second light having a shorter wavelength than the first light; a first hole transport layer between the first light-emitting layer and the anode; and a second hole transport layer between the second light-emitting layer and the anode, wherein the first hole transport layer and the second hole transport layer each include: a p-type semiconductor layer of a p-type semiconductor material provided in a form of a layer; and a n-type semiconductor material dispersed in the p-type semiconductor layer, and the n-type semiconductor material in the first hole transport layer is greater in quantity than the n-type semiconductor material in the second hole transport layer.

Advantageous Effects of Disclosure

The disclosure, in an aspect thereof, improves the charge-carrier balance between holes and electrons in a light-emitting element including a light-emitting layer containing quantum dots, thereby improving the luminous efficiency of the light-emitting element.

DESCRIPTION OF EMBODIMENTS

Figure 1:
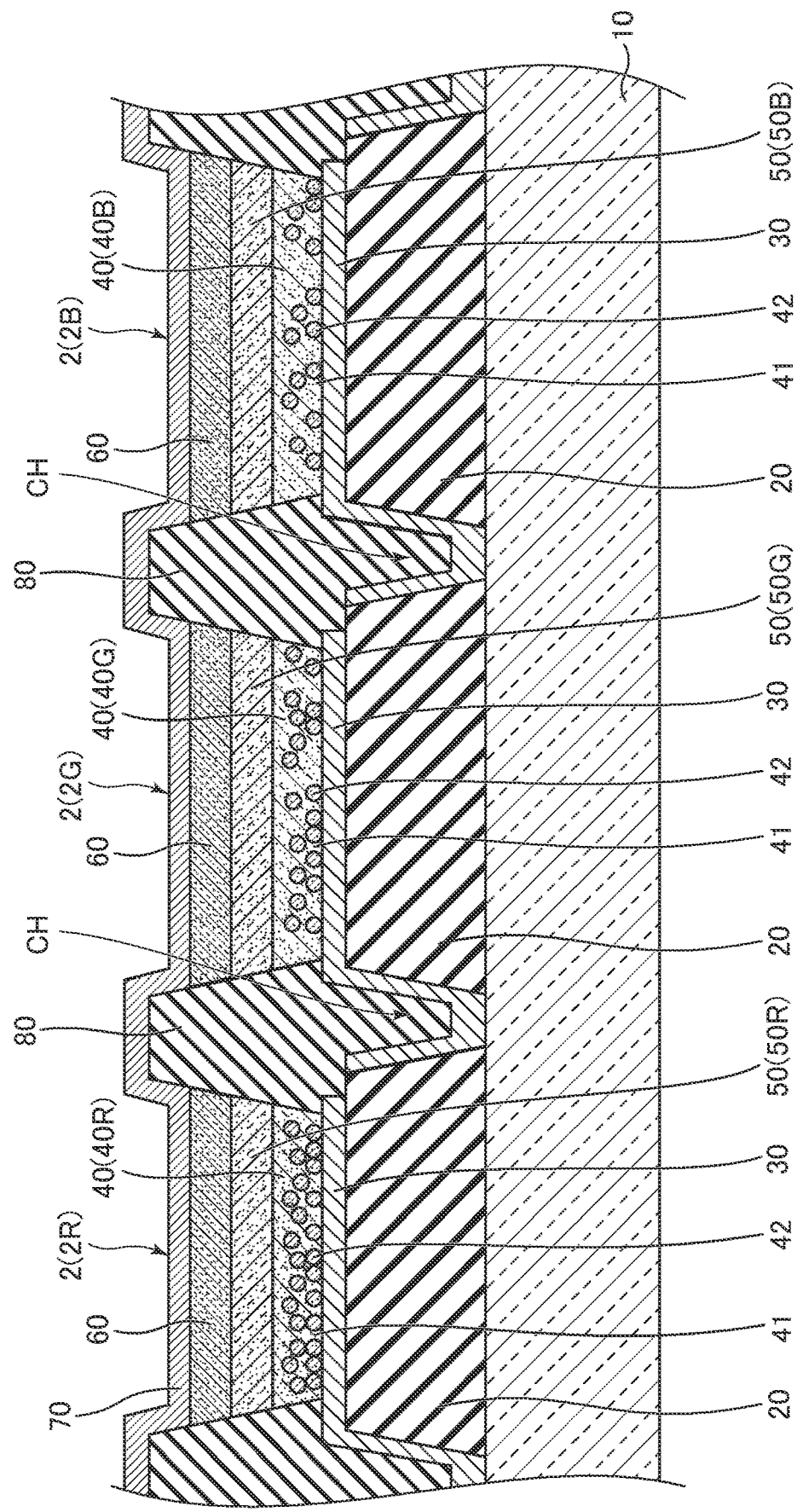
FIG. 1 is a schematic cross-sectional view of a structure of a display device in accordance with a first embodiment.

The following will describe illustrative embodiments of the disclosure with reference to drawings. Throughout the following, for convenience of description, the direction from a light-emitting element 2 toward an array substrate 10 in a display device 1 is referred to as "downward," and the direction from the array substrate 10 toward the light-emitting element 2 in the display device 1 is referred to as "upward". Identical or equivalent members are denoted by the same reference numerals throughout the drawings, and their description may not be repeated.

First Embodiment

Figure 2:
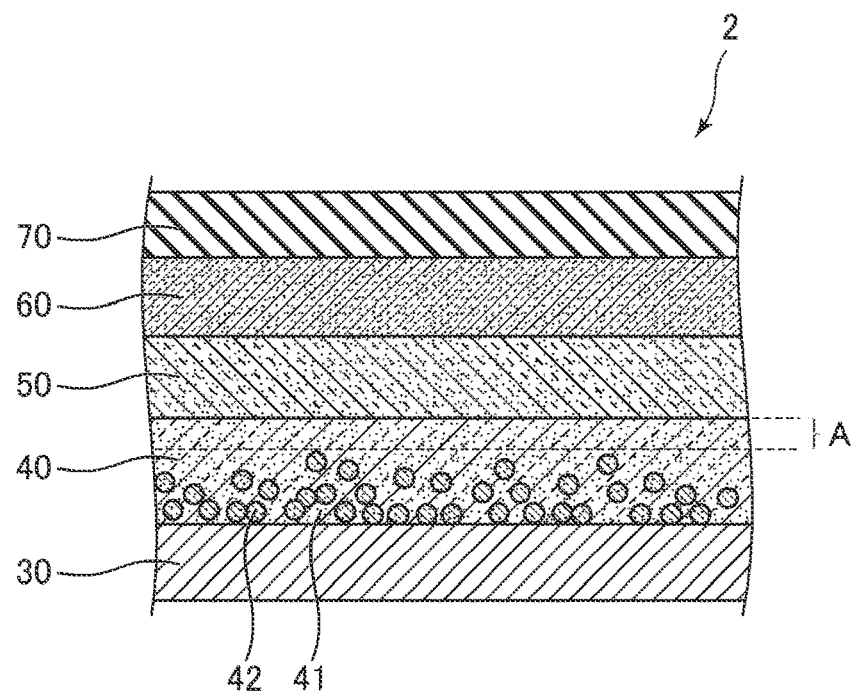
FIG. 2 is a schematic cross-sectional view of a structure of a light-emitting element in accordance with the first embodiment.

FIG. 1 is a schematic cross-sectional view of a structure of the display device 1 including light-emitting elements 2 in accordance with the present embodiment. FIG. 2 is a schematic cross-sectional view of a structure of the light-emitting element 2 in accordance with the present embodiment. The display device 1 is used, for example, as a display for a television or a smartphone. Referring to FIG. 1, the display device 1 in accordance with the present embodiment includes the light-emitting elements 2 on the array substrate 10.

The light-emitting elements 2 include, for example: red light-emitting elements 2R that emit red light (first light); green light-emitting elements 2G that emit green light (second light); and blue light-emitting elements 2B that emit blue light (third light). Each light-emitting element 2 is provided in a region separated from the other regions by an insulating bank 80 (pixel delimiting layer) on the array substrate 10. Red light refers to light that has a central emission wavelength in the range of in excess of 600 nm and less than or equal to 780 nm. Green light refers to light that has a central emission wavelength in the range of in excess of 500 nm and less than or equal to 600 nm. Blue light refers to light that has a central emission wavelength in the range of greater than or equal to 400 nm and less than or equal to 500 nm.

The array substrate 10 includes thin film transistors ("TFT's", not shown) for controlling emission of the light-emitting elements 2. The array substrate 10 in accordance with the present embodiment includes a flexible resin layer where the TFT's are formed. The resin layer in accordance with the present embodiment includes a resin film (e.g., polyimide film) and an inorganic insulation film on the resin film. The inorganic insulation film provides a barrier layer and is, for example, a silicon oxide film, a silicon nitride film, or a silicon oxynitride film. The array substrate 10 may alternatively include a rigid substrate such as a glass substrate and TFT's formed thereon. There is provided an interlayer insulation film 20 (planarization film) on the top face of the array substrate 10 in accordance with the present embodiment. The interlayer insulation film 20 is made of, for example, a polyimide or an acrylic-based material. The interlayer insulation film 20 has contact holes CH formed therethrough.

The red light-emitting elements 2R, the green light-emitting elements 2G, and the blue light-emitting elements 2B in accordance with the present embodiment each include an anode 30, a hole transport layer 40 (a first hole transport layer 40R, a second hole transport layer 40G, and a third hole transport layer 40B for the red light-emitting element 2R, the green light-emitting element 2G, and the blue light-emitting element 2B respectively), a light-emitting layer 50 (a red light-emitting layer (first light-emitting layer) 50R, a green light-emitting layer (second light-emitting layer) 50G, and a blue light-emitting layer (third light-emitting layer) 50B for the red light-emitting element 2R, the green light-emitting element 2G, and the blue light-emitting element 2B respectively), an electron transport layer 60, and a cathode 70.

The anode 30 injects holes to the hole transport layer 40. Referring to FIG. 1, the anode 30 in accordance with the present embodiment is provided in an insular manner for each region where the light-emitting element 2 is provided on the interlayer insulation film 20. The anode 30 is electrically connected to the associated one of the TFT's via the associated one of the contact holes CH in the interlayer insulation film 20. Each anode 30 includes, for example: a metal that is highly reflective to visible light such as Al, Cu, Au, or Ag; and a transparent material such as ITO, IZO, ZnO, AZO, or BZO, the metal and the material being stacked in this order on the array substrate 10. The anode 30 is formed by, for example, sputtering or vapor deposition.

The bank 80 is formed so as to cover the contact holes CH. The bank 80 is formed by, for example, applying an organic material such as a polyimide or an acrylic to the array substrate 10 and then patterning the applied organic material by photolithography. As shown in FIG. 1, the bank 80 in accordance with the present embodiment is provided so as to cover the edges of the anodes 30. In other words, the bank 80 in accordance with the present embodiment serves as an edge cover for the anodes 30. This structure restrains generation of an excess electric field along the edges of the anodes 30.

The hole transport layer 40 transports the holes injected from the anode 30 further to the light-emitting layer 50. The hole transport layer 40 is provided on, and electrically connected to, the anode 30. Specifically, the hole transport layer 40 is provided in an insular manner for each region where the light-emitting element 2 is provided.

The hole transport layer 40 includes: a p-type semiconductor layer 41 of a p-type semiconductor material provided in the form of a layer; and a n-type semiconductor material 42 dispersed in the p-type semiconductor layer 41. In other words, the hole transport layer 40 includes the p-type semiconductor layer 41 in which the n-type semiconductor material 42 is dispersed. Specifically, in the hole transport layer 40 in accordance with the present embodiment, the n-type semiconductor material 42 is completely surrounded by a p-type semiconductor material. More specifically, the n-type semiconductor material 42 in accordance with the present embodiment is nanoparticles containing a first metal oxide and having a particle diameter of, for example, 2 nm to 20 nm, both inclusive. Examples of the first metal oxide include $MoO_3$, $WO_3$, or $V_2O_5$. The p-type semiconductor material in accordance with the present embodiment contains a second metal oxide. Examples of the second metal oxide include NiO, $Cu_2O$, $Mg_xNi_{1-x}O$ (where $0 \leq x \leq 1$), $Cr_2O_3$, or $LaNiO_3$. This metal oxide-containing composition of the p-type semiconductor layer 41 and the n-type semiconductor material 42 restrains oxygen- or water-caused degradation and improves the reliability of the light-emitting elements 2.

The hole transport layer 40 in accordance with the present embodiment is formed by, for example, applying to the array substrate 10 a coating solution in which the nanoparticles containing the first metal oxide are dispersed and then baking the applied coating solution. Specifically, first, a metal oxide precursor such as a metal organic acid salt or an organometallic complex is dissolved in a medium and adjusted to prepare a coating solution. The metal oxide precursor contains metal atoms that constitute a part of the second metal oxide. More specifically, when the second metal oxide is NiO, nickel acetate or nickel acetylacetonate, as an example, is used as the metal oxide precursor. The coating solution contains dispersed therein the nanoparticles containing the first metal oxide. An ethanol-based organic solvent, as an example, is used as the medium.

Next, the coating solution is applied to the anode 30 on the array substrate 10 by, for example, inkjet technology. Thereafter, the array substrate 10 to which the medium has been applied is baked, for example, in an oxygen atmosphere, a nitrogen atmosphere, an argon atmosphere, or an atmosphere of a mixture of these gases. This concludes the formation of the hole transport layer 40 including: the p-type semiconductor layer 41 of a p-type semiconductor material provided in the form of a layer; and the n-type semiconductor material 42 dispersed in the p-type semiconductor layer 41. The structure of the hole transport layer 40 will be described later in more detail.

The light-emitting layer 50 is provided between the anode 30 and the cathode 70. Specifically, the light-emitting layer 50 in accordance with the present embodiment is provided between the hole transport layer 40 and the electron transport layer 60. The light-emitting layer 50 in accordance with the present embodiment contains quantum dots (semiconductor nanoparticles). Specifically, the light-emitting layer 50 includes a stack of at least one layer of quantum dots.

A quantum dot is a light-emitting material that has a valence band energy level and a conduction band energy level, such that the holes at the valence band energy level and the electrons at the conduction band energy level can recombine to emit light. The light emitted by the quantum dot has a narrow spectrum due to the quantum confinement effect and hence exhibits relatively deep chromaticity.

The quantum dots may be semiconductor nanoparticles that have a core/shell structure including, for example, a CdSe core and a ZnS shell. Alternatively, the quantum dots may have a core/shell structure such as a CdSe/CdS, InP/ZnS, ZnSe/ZnS, or CIGS/ZnS structure. Ligands made of, for example, an organic material such as a thiol or an amine may be coordinately bonded to the exterior of the shell.

The particle diameters of the quantum dots are approximately from 3 nm to 15 nm. The wavelength of the light emitted by the quantum dots are controllable through the particle diameter of the quantum dots. Therefore, the red light-emitting layer 50R, the green light-emitting layer 50G, and the blue light-emitting layer 50B emit red, green, and blue light respectively when quantum dots with controlled particle diameters are used in these layers.

The electron transport layer 60 transports the electrons injected from the cathode 70 further to the light-emitting layer 50. The electron transport layer 60 may have a function of restraining holes from being transported to the cathode 70 (hole blocking function). The electron transport layer 60 in accordance with the present embodiment is provided on the light-emitting layer 50. The electron transport layer 60 may contain, for example, ZnO, $TiO_2$, $Ta_2O_3$, or $SrTiO_3$ and may be formed by inkjet technology or sputtering. The electron transport layer 60 preferably has a thickness of from 10 nm to 100 nm, both inclusive, for the formation of a uniform film and also for the efficient transport of electrons to the light-emitting layer 50.

The cathode 70 injects electrons to the electron transport layer 60. Specifically, the cathode 70 in accordance with the present embodiment is provided on, and electrically connected to, the electron transport layer 60. The cathode 70 is made of, for example, a transparent material or a metal that is so thin that the cathode 70 can transmit light. The metal for the cathode 70 is, for example, an Al, Ag, or Mg-containing metal. The transparent material for the cathode 70 is, for example, ITO, IZO, ZnO, AZO, or BZO. The cathode 70 is formed by, for example, sputtering or vapor deposition.

There is also provided a sealing layer (not shown) on the cathode 70 in accordance with the present embodiment. The sealing layer includes, for example: an inorganic sealing film covering the cathode 70; an organic layer composed of an organic buffer film overlying the inorganic sealing film; and an inorganic sealing film overlying the organic buffer film. The sealing layer prevents foreign objects such as water and oxygen from reaching the inside of the display device 1. The inorganic sealing film is an inorganic insulation film and is a silicon oxide film, a silicon nitride film, a silicon oxynitride film, or a stack of these films. The films are formed by, for example, CVD. The organic buffer film is a transparent organic film that exhibits a planarization effect and may be made of, for example, an organic material, such as acrylic, that can be provided by printing or coating technology. There may be provided a functional film (not shown) on the sealing layer. The functional film may have, for example, at least one of an optical compensation function, a touch sensor function, and a protection function.

In relation to the display device 1 in accordance with the present embodiment, the description discusses, as an example, a top-emission element where the light emitted by the light-emitting layer 50 leaves the element through a side opposite from the array substrate 10 (through the top in FIG. 1). Alternatively, the light-emitting element 2 may be a bottom-emission element where the light leaves the element through the array substrate 10 side (through the bottom in FIG. 1), in which case the cathode 70 is made of a reflective electrode, and the anode 30 is made of a transparent electrode. The display device 1 in accordance with the present embodiment includes the anode 30, the hole transport layer 40, the light-emitting layer 50, the electron transport layer 60, and the cathode 70, all stacked in this order when viewed from the array substrate 10. Alternatively, the display device 1 may have a so-called inverted structure where the cathode 70, the electron transport layer 60, the light-emitting layer 50, the hole transport layer 40, and the anode 30 are stacked in this order when viewed from the array substrate 10.

Figure 3:
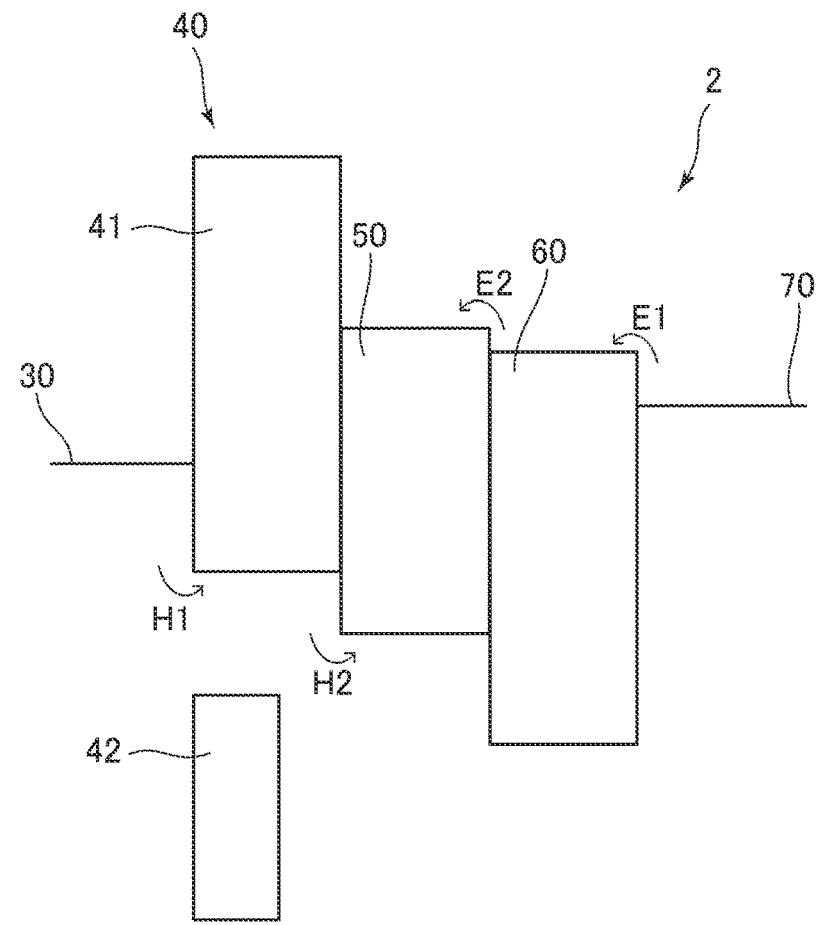
FIG. 3 is an energy diagram representing the electron affinity and ionization potential of each layer in the light-emitting element in accordance with the first embodiment.

A description is given next of the structure and light-emission mechanism of the light-emitting element 2 in accordance with the present embodiment from the viewpoint of the relationships between the energy levels of the layers. FIG. 3 is an energy diagram representing the relationships between the Fermi level, electron affinity, and ionization potential of each layer in the light-emitting element 2 in accordance with the first embodiment. FIG. 3 shows the anode 30, the hole transport layer 40, the light-emitting layer 50, the electron transport layer 60, and the cathode 70 from left to right.

The anode 30 and the cathode 70 are represented by the Fermi levels thereof in the example in FIG. 3. Bottom of the hole transport layer 40, the light-emitting layer 50, and the electron transport layer 60 are shown the ionization potentials thereof relative to the vacuum energy level. Top of the hole transport layer 40, the light-emitting layer 50, and the electron transport layer 60 are shown the electron affinities thereof relative to the vacuum energy level. The Fermi levels, the ionization potentials, and the electron affinities are given in units of electron volts (eV). The electron affinity may be defined as an energy gap between the bottom of the conduction band (the top of the hole transport layer 40, the light-emitting layer 50, or the electron transport layer 60 in FIG. 3) and the vacuum energy level. The ionization potential may be defined as an energy gap between the top of the valence band (the bottom of the hole transport layer 40, the light-emitting layer 50, or the electron transport layer 60 in FIG. 3) and the vacuum energy level. Throughout the rest of the specification, the ionization potential and the electron affinity, when simply described, will be described relative to the vacuum energy level.

The example in FIG. 3 assumes that the anode 30 is made of ITO and the cathode 70 is made of Al. In this example, the anode 30 has a Fermi level of 4.6 eV, and the cathode 70 has a Fermi level of 4.3 eV. The example in FIG. 3 also assumes that the electron transport layer 60 is made of ZnO. In the example, the electron transport layer 60 has an ionization potential of 7.4 eV, and the electron transport layer 60 has an electron affinity of 4.0 eV. In the example in FIG. 3, the light-emitting layer 50 has an ionization potential of 6.0 to 7.0 eV, and the light-emitting layer 50 has an electron affinity of 3.5 to 4.0 eV. The light-emitting layer 50 has an ionization potential of 5.5 eV, 5.6 eV, and 5.7 eV when the quantum dots in the light-emitting layer 50 are made of, for example, CdSe, InP, and ZnSe respectively. The ionization potential and electron affinity of the light-emitting layer 50 are adjustable by controlling the particle diameter and composition of the quantum dots.

The example in FIG. 3 assumes that the p-type semiconductor layer 41 in the hole transport layer 40 is made of NiO, in which case the p-type semiconductor layer 41 has an ionization potential of 5.4 eV and an electron affinity of 2.0 eV The example in FIG. 3 further assumes that the n-type semiconductor material 42 dispersed in the p-type semiconductor layer 41 is made of $MoO_3$, in which case the n-type semiconductor material 42 has an ionization potential of 9.4 eV and an electron affinity of 6.4 eV.

Referring to FIG. 3, the holes injected from the anode 30 (arrow H1) and the electrons injected from the cathode 70 (arrow E1) are transported to the light-emitting layer 50 via the hole transport layer 40 and the electron transport layer 60 (arrow H2 and arrow E2) respectively. These electrons and holes transported to the light-emitting layer 50 recombine inside the quantum dots, thereby generating excitons. The quantum dots emit light when the excitons return from the excited state to the ground state.

As described above, the n-type semiconductor material 42 is dispersed in the p-type semiconductor layer 41 in the hole transport layer 40 in accordance with the present embodiment. The n-type semiconductor material 42 extracts electrons from p-type semiconductor material, to generate holes in the p-type semiconductor material. Hence, in the light-emitting element 2 in accordance with the present embodiment, the hole transport layer 40 has such an increased concentration of holes that more holes are transported to the light-emitting layer 50. It is inferred that this mechanism of transporting holes from the hole transport layer 40 to the light-emitting layer in the light-emitting element 2 in accordance with the present embodiment proceeds as in the following.

Figure 4:
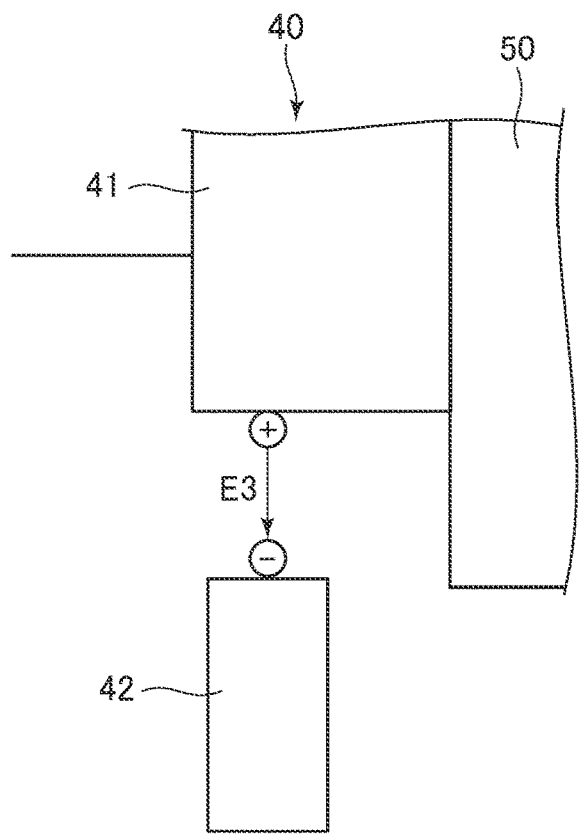
FIG. 4 is an energy diagram representing the electron affinity and ionization potential of each layer in the light-emitting element in accordance with the first embodiment.
Figure 5:
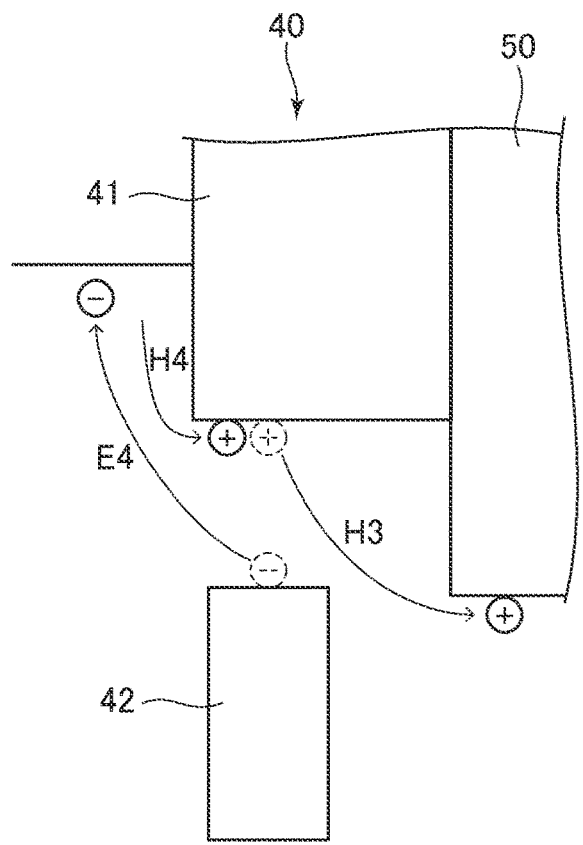
FIG. 5 is an energy diagram representing the electron affinity and ionization potential of each layer in the light-emitting element in accordance with the first embodiment.
Figure 6:
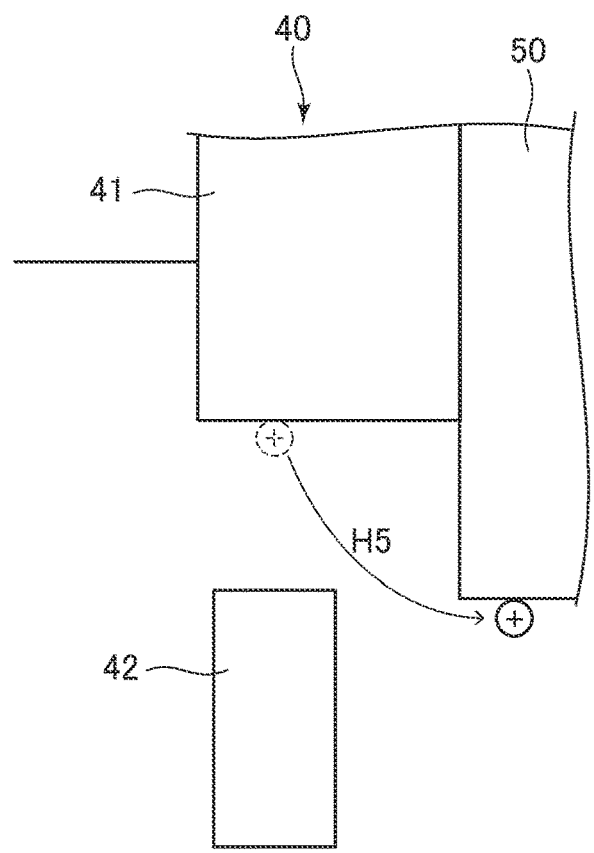
FIG. 6 is an energy diagram representing the electron affinity and ionization potential of each layer in the light-emitting element in accordance with the first embodiment.

FIG. 4 is an energy diagram for the layers, conceptually showing how the n-type semiconductor material 42 extracts electrons from the p-type semiconductor material in the light-emitting element 2 in accordance with the present embodiment. FIG. 5 is an energy diagram for the layers, conceptually showing how electrons conduct from the hole transport layer 40 to the anode 30 and how holes are transported from the hole transport layer 40 to the light-emitting layer 50 in the light-emitting element 2 in accordance with the present embodiment. FIG. 6 is an energy diagram for the layers, conceptually showing how holes are transported from the hole transport layer 40 to the light-emitting layer 50 in the light-emitting element 2 in accordance with the present embodiment. In the examples in FIGS. 4 to 6, the anode 30 and the cathode 70 are represented by the Fermi levels thereof similarly to the example in FIG. 3. Below the hole transport layer 40 and the light-emitting layer 50 are shown the ionization potentials thereof relative to the vacuum energy level. Above the hole transport layer 40 is shown the electron affinity thereof relative to the vacuum energy level.

Referring to FIG. 4, in the hole transport layer 40 in accordance with the present embodiment, the electron affinity of the n-type semiconductor material 42 is larger than the ionization potential of the p-type semiconductor material in the p-type semiconductor layer 41. The electrons in the valence band of the p-type semiconductor material are thus extracted (transition) to the conduction band of the n-type semiconductor material 42, leaving holes behind in the valence band of the p-type semiconductor material as indicated by arrow E3 in FIG. 4. Therefore, the hole transport layer 40 in accordance with the present embodiment accumulates the holes generated by the extraction of electrons by the n-type semiconductor material 42 as well as the holes injected from the anode 30, which increases the concentration of holes in the hole transport layer 40. The p-type semiconductor material and the n-type semiconductor material 42 are preferably bonded together by oxygen. This particular structure facilitates the extraction of electrons from the p-type semiconductor material, thereby further increasing the concentration of holes in the hole transport layer 40.

As shown in FIG. 5, the holes generated by the extraction of electrons in the p-type semiconductor material are transported to the light-emitting layer 50 (arrow H3). Meanwhile, the electrons extracted by the n-type semiconductor material 42 conduct to the anode 30 as indicated by arrow E4. Then, more holes are injected from the anode 30 due to the conduction (arrow H3) of electrons to the anode 30, which further promotes the injection of holes from the anode 30 in the hole transport layer 40 in accordance with the present embodiment. As a result, the hole transport layer 40 has a further increased concentration of holes. The energy gap between the electron affinity of the n-type semiconductor material 42 and the ionization potential of the p-type semiconductor material is preferably 1.5 eV or smaller. This particular structure further facilitates the conduction of electrons from the n-type semiconductor material 42 to the anode 30, thereby further increasing the concentration of holes in the hole transport layer 40.

As shown in FIG. 6, the holes injected from the anode 30 due to the conduction of electrons from the n-type semiconductor material 42 to the anode 30 are further transported to the light-emitting layer 50 (arrow H5). Since the light-emitting element 2 in accordance with the present embodiment is so structured as to enable increases in the concentration of holes in the hole transport layer 40, holes are transported in greater numbers to the light-emitting layer 50, as detailed here.

In known light-emitting elements, the holes transported to the light-emitting layer 50 are insufficient in comparison to the electrons transported to the light-emitting layer 50. The excess electrons that do not contribute to the emission of light hence conduct to the anode 30 in the known light-emitting element. Sufficient emission of light is not achieved in comparison to the current supply to the light-emitting element, which makes it difficult to improve luminous efficiency. In contrast, since in the light-emitting element 2 in accordance with the present embodiment, the concentration of holes in the hole transport layer 40 can be increased, holes are transported in sufficient numbers to the light-emitting layer 50 for the electrons transported to the light-emitting layer 50. As a result, the light-emitting element 2 exhibits an improved charge-carrier balance between the electrons and holes transported to the light-emitting layer 50 and hence exhibits an improved luminous efficiency.

Although the mechanisms shown as examples in FIGS. 3 to 6 described above have been described separately for convenience of description, at least the transport of holes from the hole transport layer 40 to the light-emitting layer 50 (arrows H2, H3, and H5) may simultaneously proceed. Additionally, although the mechanisms shown as examples in FIGS. 4 to 6 have been described as involving a single electron and a single hole for easy understanding, the mechanisms may involve a plurality of electrons and a plurality of holes.

A description is given next of the structure of the hole transport layer 40 in accordance with the present embodiment in more detail. Referring to FIG. 2, the p-type semiconductor layer 41 is in contact with the anode 30 in the hole transport layer 40 in accordance with the present embodiment. The n-type semiconductor material 42 is also in contact with the anode 30 in the hole transport layer 40 in accordance with the present embodiment. In other words, both the p-type semiconductor layer 41 and the n-type semiconductor material 42 are in contact with the anode 30 in the hole transport layer 40 in accordance with the present embodiment.

Since the n-type semiconductor material 42 has a high concentration of electrons, the electrons therein more readily conduct to the anode 30 than those in the p-type semiconductor material. The electrons extracted from the p-type semiconductor material to the n-type semiconductor material 42 therefore more readily conduct to the anode 30 since the n-type semiconductor material 42 is in contact with the anode 30. As a result, the holes are more readily injected from the anode 30 to the hole transport layer 40, which further increases the concentration of holes in the hole transport layer 40. Additionally, since the p-type semiconductor layer 41, which is provided in the form of a layer, is in contact with the anode 30, the gap (empty space) between the anode 30 and the hole transport layer 40 is reduced. This particular structure increases the contact area between the hole transport layer 40 and the anode 30 in the light-emitting element 2 in accordance with the present embodiment, thereby lowering contact resistance between the anode 30 and the hole transport layer 40. The structure thus lowers drive voltage, hence improving luminous efficiency, in the light-emitting element 2 in accordance with the present embodiment.

In the hole transport layer 40 in accordance with the present embodiment, the quantity of nanoparticles, including those in the n-type semiconductor material 42 in the hole transport layer 40, decreases as moving from near the anode 30 to near the light-emitting layer 50. The p-type semiconductor layer 41 preferably has a region A residing in contact with the light-emitting layer 50 and extending from the light-emitting layer 50 toward the anode 30, the region A containing no n-type semiconductor material 42, as shown in FIG. 2. This particular structure enables reducing the energy gap between the light-emitting layer 50 and the hole transport layer 40 and preventing electrons from directly flowing from the light-emitting layer 50 to the n-type semiconductor material 42 even when the n-type semiconductor material 42 is dispersed in the p-type semiconductor layer 41 in the hole transport layer 40. The structure therefore facilitates the transport to the light-emitting layer 50 of the holes accumulated in the hole transport layer 40, thereby further improving the luminous efficiency of the light-emitting element 2.

The region A preferably has a thickness of 2 nm or greater as measured from the light-emitting layer 50 toward the anode 30, for more efficient transport of holes to the light-emitting layer 50. The n-type semiconductor material 42 preferably has a volume fraction of 50% or less in the hole transport layer 40 for the formation of the uniform hole transport layer 40.

As shown in FIG. 1, in the display device 1 in accordance with the present embodiment, the quantity of the n-type semiconductor material 42 in the first hole transport layer 40R in the red light-emitting element 2R is larger than the quantity of the n-type semiconductor material 42 in the second hole transport layer 40G in the green light-emitting element 2G. The quantity of the n-type semiconductor material 42 in the second hole transport layer 40G in the green light-emitting element 2G is larger than the quantity of the n-type semiconductor material 42 in the third hole transport layer 40B in the blue light-emitting element 2B. This particular structure improves the charge-carrier balance between the electrons transported from the electron transport layer 60 to the light-emitting layer 50 and the holes transported from the hole transport layer 40 to the light-emitting layer 50 in the red light-emitting element 2R, the green light-emitting element 2G, and the blue light-emitting element 2B in the display device 1.

Specifically, when the quantum dots in the light-emitting layer 50 are made of, for example, CdSe, the emission wavelength decreases with a decrease in the particle diameter of the quantum dots, and the electron affinity of the light-emitting layer 50 decreases with a decrease in the particle diameter of the quantum dots. In contrast, the ionization potential of the light-emitting layer 50 changes little with a decrease in the particle diameter of the quantum dots. Therefore, when the light-emitting layer 50 contains quantum dots with a smaller particle diameter, a larger energy gap is needed to transport electrons from the electron transport layer 60 to the light-emitting layer 50, whereas the energy gap needed to transport holes from the hole transport layer 40 to the light-emitting layer 50 changes little.

Therefore, when the hole transport layers 40 in the red light-emitting element 2R, the green light-emitting element 2G, and the blue light-emitting element 2B contain the same amount of n-type semiconductor material 42, electrons are insufficient in comparison to the holes transported to the light-emitting layer 50 in the green light-emitting element 2G and the blue light-emitting element 2B where fewer electrons are transported to the light-emitting layer 50 than in the red light-emitting element 2R. However, the charge-carrier balance between the electrons transported from the electron transport layer 60 to the light-emitting layer 50 and the holes transported from the hole transport layer 40 to the light-emitting layer 50 is improved in the light-emitting element 2, by reducing the quantity of the n-type semiconductor material 42 in the hole transport layer 40 in the order of the red light-emitting element 2R, the green light-emitting element 2G, and the blue light-emitting element 2B as in the display device 1 in accordance with the present embodiment. This particular structure improves the luminous efficiency of the display device 1.

Second Embodiment

Figure 7:
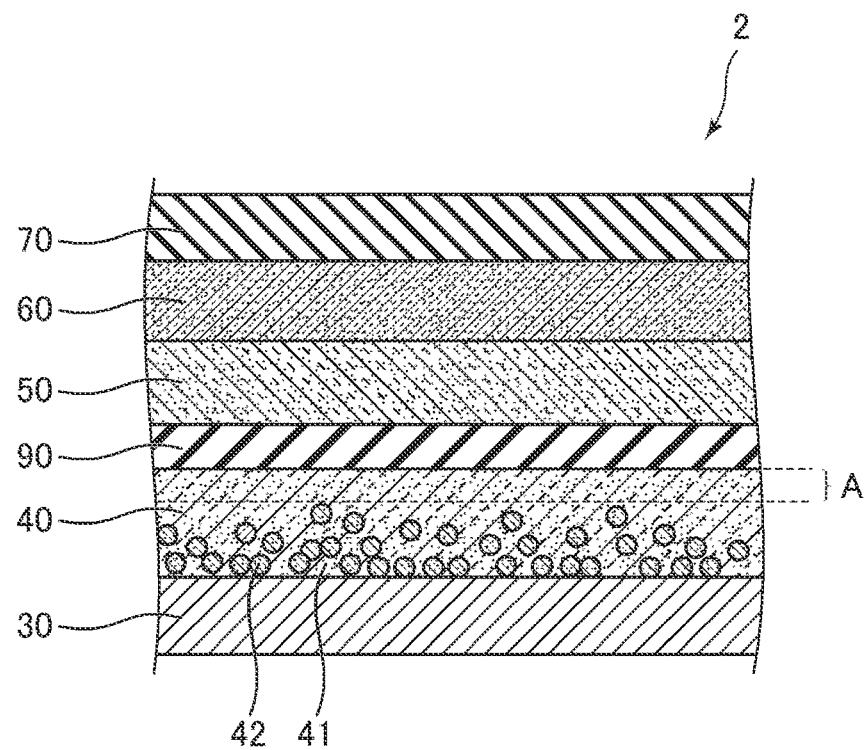
FIG. 7 is a schematic cross-sectional view of a structure of a light-emitting element in accordance with a second embodiment.

A description is given next of a second embodiment. The description will focus on differences from the first embodiment. No description will be repeated on features of the second embodiment that are similar to those of the first embodiment. FIG. 7 is a schematic cross-sectional view of a structure of a light-emitting element 2 in accordance with the present embodiment.

The light-emitting element 2 in accordance with the present embodiment includes an anode 30, a hole transport layer 40, a light-emitting layer 50, an electron transport layer 60, and a cathode 70. The light-emitting element 2 in accordance with the present embodiment further includes an intermediate layer 90 between the hole transport layer 40 and the light-emitting layer 50.

The intermediate layer 90 restrains the electrons transported to the light-emitting layer 50 from further conducting to the hole transport layer 40. Specifically, the intermediate layer 90 in accordance with the present embodiment may contain, for example, an inorganic material such as SiN, $SiO_2$, MgO, $ZrO_2$, or $Al_2O_3$ and may contain, for example, an organic material such as PMMA, PVK, TFB, or poly-TPD. The intermediate layer 90 is more preferably made of, for example, an organic material because organic materials are readily provided by, for example, coating and restrained from quenching. The composition of the intermediate layer 90 is not limited to these examples and needs only to have an electron blocking function. This particular structure improves the charge-carrier balance between electrons and holes in the light-emitting layer 50, thereby improving the luminous efficiency of the light-emitting element 2. The intermediate layer 90 preferably has a thickness of 2 nm or greater as measured from the light-emitting layer 50 toward the anode 30, for more effective restraining of the conduction of electrons to the hole transport layer 40. When the intermediate layer 90 contains an inorganic material such as SiN, SiO$_2$, MgO, ZrO$_2$, or Al$_2$O$_3$, the thickness is preferably 5 nm or less so that holes can conduct to the light-emitting layer 50 by tunneling effect.

Third Embodiment

Figure 8:
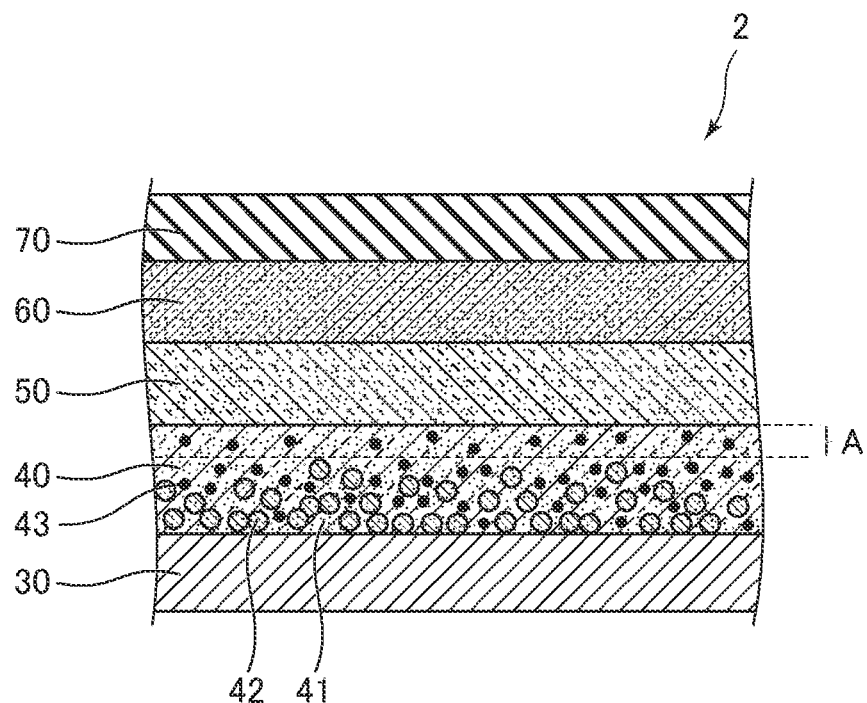
FIG. 8 is a schematic cross-sectional view of a structure of a light-emitting element in accordance with a third embodiment.

A description is given next of a third embodiment. The description will focus on differences from the preceding embodiments. No description will be repeated on features of the third embodiment that are similar to those of the preceding embodiments. The third embodiment differs from the preceding embodiments in the structure of the hole transport layer 40. FIG. 8 is a schematic cross-sectional view of a structure of a light-emitting element 2 in accordance with the present embodiment.

The light-emitting element 2 in accordance with the present embodiment includes an anode 30, a hole transport layer 40, a light-emitting layer 50, an electron transport layer 60, and a cathode 70. The hole transport layer 40 in accordance with the present embodiment includes a p-type semiconductor layer 41 with the carbon content ratio thereof being adjusted to a prescribed value. The p-type semiconductor layer 41 in accordance with the present embodiment contains a second metal oxide. The carbon content ratio in this context is the ratio of the quantity of carbon atoms to the quantity of metal atoms (carbon atom/metal atom) in the p-type semiconductor layer 41.

The carbon in the p-type semiconductor layer 41 is, for example, contained in the aforementioned metal oxide precursor and remains in the hole transport layer 40 after baking. The carbon content ratio of the p-type semiconductor layer 41 is controllable through the baking temperature. For instance, if the baking temperature is 180° C., 200° C., 230° C., 280° C., 330° C., and 400° C., the carbon content of the p-type semiconductor layer 41 is approximately 23.8%, 6%, 4.2%, 1.5%, and 1.2% respectively.

The increased carbon content of the p-type semiconductor layer 41, although restraining quenching, reduces the concentration of holes. That could in turn lead to a poor charge-carrier balance in the light-emitting element 2 and hence a low luminous efficiency or lead to an increased resistance and hence a low current. The presence of the n-type semiconductor material 42 increases the concentration of holes, thereby increasing luminous efficiency, especially when the p-type semiconductor layer 41 has a high carbon content.

When the carbon content ratio of the p-type semiconductor layer 41 is, for example, less than or equal to 1.5%, the excitons are quenched in the hole transport layer 40, which lowers the luminous efficiency of the light-emitting element 2. Meanwhile, when the carbon content ratio of the p-type semiconductor layer 41 is in excess of 23.8%, the metal oxide is not readily produced in the p-type semiconductor layer 41, which could disrupt the transport of holes to the light-emitting layer 50. Accordingly, the carbon content ratio of the p-type semiconductor layer 41 in accordance with the present embodiment, as given by the atomic ratio thereof to the metal atoms in the second metal oxide, is preferably from 1.5% to 23.8%, both inclusive, for the improved luminous efficiency of the light-emitting element 2.

Variation Examples

The description has so far discussed primary embodiments of the disclosure. The disclosure is however not limited to these embodiments.

The embodiments describe the p-type semiconductor material in the p-type semiconductor layer 41 as containing a metal oxide. Alternatively, the p-type semiconductor material may contain, for example, an organic material such as PEDOT:PSS. This composition increases the concentration of holes in the hole transport layer 40, similarly to the compositions in the embodiments. That in turn improves the charge-carrier balance between the electrons and holes transported to the light-emitting layer 50, thereby improving the luminous efficiency of the light-emitting element 2.

The embodiments describe the hole transport layer 40 as being formed by coating. Alternatively, the hole transport layer 40 may be formed by, for example, vapor deposition or sputtering. When the hole transport layer 40 is formed by vapor deposition, at least two vapor deposition sources are used: namely, a vapor deposition source for the vapor deposition of the p-type semiconductor material and another vapor deposition source for the vapor deposition of the n-type semiconductor material 42. Meanwhile, when the hole transport layer 40 is formed by sputtering, at least two targets are used: namely, a target containing the p-type semiconductor material and another target containing the n-type semiconductor material 42. These methods can form the hole transport layer 40 including: the p-type semiconductor layer 41 of a p-type semiconductor material provided in the form of a layer; and the n-type semiconductor material 42 dispersed in the p-type semiconductor layer 41, similarly to the methods used in the embodiments.

The embodiments describe the light-emitting layer 50 as containing quantum dots. Alternatively, the light-emitting layer 50 in accordance with the disclosure may not contain quantum dots, in which case the light-emitting layer 50 is made of, for example, an organic fluorescent or phosphorescent material.

Any of the elements described in the embodiments and variation examples may be used in a proper combination so long as the combination works out well.

The invention claimed is:

1. A light-emitting element comprising:
    an anode;
    a cathode;
    a light-emitting layer between the anode and the cathode; and
    a hole transport layer between the anode and the light-emitting layer, the hole transport layer comprising:
    a p-type semiconductor layer comprising a p-type semiconductor material provided in a form of a layer; and
    an n-type semiconductor material dispersed in the p-type semiconductor layer,
    wherein the n-type semiconductor material comprises nanoparticles containing a first metal oxide, and
    the nanoparticles are confined within the hole transport layer.

2. The light-emitting element according to claim 1, wherein the n-type semiconductor material in the hole transport layer decreases in quantity as moving from an anode side of the hole transport layer to a light-emitting layer side of the hole transport layer.

3. The light-emitting element according to claim 1, wherein the n-type semiconductor material in the hole transport layer has a volume fraction of less than or equal to 50%.

4. The light-emitting element according to claim 1, wherein the p-type semiconductor layer has a region in contact with the light-emitting layer and extending from a light-emitting layer side toward an anode side, the region not containing any n-type semiconductor material.

5. The light-emitting element according to claim 1, wherein the first metal oxide contains any of $MoO_3$, $WO_3$, and $V_2O_5$.

6. The light-emitting element according to claim 1, wherein the p-type semiconductor layer contains a second metal oxide.

7. The light-emitting element according to claim 6, wherein the second metal oxide contains any of NiO, $Cu_2O$, $Mg_xNi_{1-x}O$, $Cr_2O_3$, and $LaNiO_3$, where $0 \leq x \leq 1$.

8. The light-emitting element according to claim 6, wherein the p-type semiconductor layer further contains carbon with a carbon content ratio thereof being adjusted to a prescribed value.

9. The light-emitting element according to claim 8, wherein the carbon content ratio of the p-type semiconductor layer is from 1.5% to 23.8%, both inclusive, the carbon content ratio is an atomic ratio of carbon atoms to metal atoms in the second metal oxide.

10. A display device comprising:
an anode;
a cathode;
a first light-emitting layer between the anode and the cathode, the first light-emitting layer being configured to emit first light;
a second light-emitting layer between the anode and the cathode, the second light-emitting layer being configured to emit second light having a wavelength shorter than a wavelength of the first light;
a first hole transport layer between the first light-emitting layer and the anode; and
a second hole transport layer between the second light-emitting layer and the anode, wherein
each of the first hole transport layer and the second hole transport layer comprises:
a p-type semiconductor layer comprising a p-type semiconductor material provided in a form of a layer; and
an n-type semiconductor material dispersed in the p-type semiconductor layer, and
the n-type semiconductor material in the first hole transport layer is greater in quantity than the n-type semiconductor material in the second hole transport layer.

11. The display device according to claim 10, further comprising:
a third light-emitting layer between the anode and the cathode, the third light-emitting layer being configured to emit third light having a wavelength shorter than a wavelength of the second light; and
a third hole transport layer between the third light-emitting layer and the anode, wherein
the third hole transport layer comprises the p-type semiconductor layer and the n-type semiconductor material, and the n-type semiconductor material in the second hole transport layer is greater in quantity than the n-type semiconductor material in the third hole transport layer.

12. The display device according to claim 11, wherein
the first light is red light,
the second light is green light, and
the third light is blue light.

13. The display device according to claim 10, wherein the n-type semiconductor material comprises nanoparticles containing a first metal oxide.

14. The display device according to claim 13, wherein the first metal oxide contains any of $MoO_3$, $WO_3$, and $V_2O_5$.

15. The display device according to claim 10, wherein the p-type semiconductor material contains a second metal oxide.

16. The display device according to claim 15, wherein the second metal oxide contains any of NiO, $Cu_2O$, $Mg_xNi_{1-x}O$, $Cr_2O_3$, and $LaNiO_3$, where $0 \leq x \leq 1$.

17. The display device according to claim 10, wherein
the n-type semiconductor material comprises nanoparticles containing a first metal oxide,
the p-type semiconductor material contains a second metal oxide,
the first metal oxide contains $MoO_3$, and
the second metal oxide contains NiO.

18. A light-emitting element comprising:
an anode;
a cathode;
a light-emitting layer between the anode and the cathode; and
a hole transport layer between the anode and the light-emitting layer, the hole transport layer comprising:
a p-type semiconductor layer comprising a p-type semiconductor material provided in a form of a layer; and
an n-type semiconductor material dispersed in the p-type semiconductor layer,
wherein
the n-type semiconductor material comprises nanoparticles containing a first metal oxide,
the p-type semiconductor material contains a second metal oxide,
the first metal oxide contains MoO3, and
the second metal oxide contains NiO.

19. The light-emitting element according to claim 18, wherein the p-type semiconductor layer contains carbon with a carbon content ratio thereof being adjusted to a prescribed value.

20. The light-emitting element according to claim 19, wherein the carbon content ratio of the p-type semiconductor layer is from 1.5% to 23.8%, both inclusive, as given by an atomic ratio thereof to metal atoms in the second metal oxide in the p-type semiconductor layer.

* * * * *